US006906960B2

(12) United States Patent
Saito et al.

(10) Patent No.: US 6,906,960 B2
(45) Date of Patent: Jun. 14, 2005

(54) SEMICONDUCTOR MEMORY DEVICE (75) Inventors: Hidetoshi Saito, Yamato (JP); Hideo Kato, Kawasaki (JP); Tokumasa Hara, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/383,633

(22) Filed: Mar. 10, 2003

(65) Prior Publication Data
US 2003/0227800 A1 Dec. 11, 2003

(30) Foreign Application Priority Data

Mar. 11, 2002  (JP) ........................................ 2002-065805

(51) Int. Cl.[7] .............................................. G11C 16/04
(52) U.S. Cl. ............................ 365/185.29; 365/185.04; 365/230.03
(58) Field of Search ....................... 365/185.29, 185.04, 365/189.07, 189.03, 218, 230.03, 185.11, 185.28

(56) References Cited

U.S. PATENT DOCUMENTS

| 5,959,887 | A | * | 9/1999 | Takashina et al. ..... 365/185.13 |
| 6,377,502 | B1 | | 4/2002 | Honda et al. |
| 6,418,061 | B1 | * | 7/2002 | Kitazaki ................ 365/185.29 |
| 6,512,693 | B2 | | 1/2003 | Honda et al. |

FOREIGN PATENT DOCUMENTS

| JP | 2001-60397 | 3/2001 |
| JP | 2001-325795 | 11/2001 |

* cited by examiner

Primary Examiner—Vu A. Le
(74) Attorney, Agent, or Firm—Oblon, Spivak, McClelland, Maier & Neustadt, P.C.

(57) ABSTRACT

A semiconductor memory device includes: a plurality of banks with electrically rewritable memory cells arranged therein, the banks being configured to be simultaneously accessible in such a manner that a data write operation into a bank and a data read operation for another bank are simultaneously performed; a write-use data bus commonly disposed for the plurality of banks; a read-use data bus commonly disposed for the plurality of banks; a write circuit connected to the write-use data bus; a read circuit connected to the read-use data bus; a bank address decoder circuit for decoding external bank address signals for bank selecting to output internal bank address signals, the bank address decoder circuit having such an address conversion function that one of plural kinds of address conversions between the external bank address signals and the internal bank address signals is selectable; and a rewrite control circuit for sequence controlling a data write operation for a bank selected by the bank address decoder circuit.

9 Claims, 9 Drawing Sheets

TRANS1="L", TRANS2="L"

[External Add.]      [Internal Add.]

| A21 | A20 | A19 | BA21 | BA20 | BA19 | Bank | |
|---|---|---|---|---|---|---|---|
| 1 | 1 | 1 | 1 | 1 | 1 | BANK3 | (BLK3) |
| 1 | 1 | 0 | 1 | 1 | 0 | | |
| 1 | 0 | 1 | 1 | 0 | 1 | BANK2 | (BLK2) |
| 1 | 0 | 0 | 1 | 0 | 0 | | |
| 0 | 1 | 1 | 0 | 1 | 1 | | |
| 0 | 1 | 0 | 0 | 1 | 0 | BANK1 | (BLK1) |
| 0 | 0 | 1 | 0 | 0 | 1 | | |
| 0 | 0 | 0 | 0 | 0 | 0 | BANK0 | (BLK0) |

FIG. 10

TRANS1="H", TRANS2="L"

[External Add.]      [Internal Add.]

| A21 | A20 | A19 | BA21 | BA20 | BA19 | Bank | |
|---|---|---|---|---|---|---|---|
| 1 | 1 | 1 | 0 | 0 | 0 | BANK3 | (BLK0) |
| 1 | 1 | 0 | 0 | 0 | 1 | | |
| 1 | 0 | 1 | 0 | 1 | 0 | BANK2 | (BLK1) |
| 1 | 0 | 0 | 0 | 1 | 1 | | |
| 0 | 1 | 1 | 1 | 0 | 0 | | |
| 0 | 1 | 0 | 1 | 0 | 1 | BANK1 | (BLK2) |
| 0 | 0 | 1 | 1 | 1 | 0 | | |
| 0 | 0 | 0 | 1 | 1 | 1 | BANK0 | (BLK3) |

FIG. 11

TRANS1="L", TRANS2="H"

[External Add.]      [Internal Add.]

| A21 | A20 | A19 | BA21 | BA20 | BA19 | Bank | |
|---|---|---|---|---|---|---|---|
| 1 | 1 | 1 | 1 | 1 | 1 | BANK3 | (BLK3) |
| 1 | 1 | 0 | 0 | 0 | 0 | BANK2 | (BLK0) |
| 1 | 0 | 1 | 0 | 0 | 1 | BANK1 | (BLK1) |
| 1 | 0 | 0 | 0 | 1 | 0 | | |
| 0 | 1 | 1 | 0 | 1 | 1 | | |
| 0 | 1 | 1 | 1 | 0 | 0 | BANK0 | (BLK2) |
| 0 | 1 | 0 | 1 | 0 | 1 | | |
| 0 | 0 | 0 | 1 | 1 | 0 | | |

FIG. 12

TRANS1="H", TRANS2="H"

[External Add.]      [Internal Add.]

| A21 | A20 | A19 | BA21 | BA20 | BA19 | Bank | |
|---|---|---|---|---|---|---|---|
| 1 | 1 | 1 | 1 | 1 | 0 | | |
| 1 | 1 | 0 | 1 | 0 | 1 | BANK3 | (BLK2) |
| 1 | 0 | 1 | 1 | 0 | 0 | | |
| 1 | 0 | 0 | 0 | 1 | 1 | | |
| 0 | 1 | 1 | 0 | 1 | 0 | BANK2 | (BLK1) |
| 0 | 1 | 0 | 0 | 0 | 1 | | |
| 0 | 0 | 1 | 0 | 0 | 0 | BANK1 | (BLK0) |
| 0 | 0 | 0 | 1 | 1 | 1 | BANK0 | (BLK3) |

FIG. 14

| ExternalA21 | ExternalA20 | ExternalA19 | Bank |
|---|---|---|---|
| 1 | 1 | 1 | BANK3 |
| 1 | 1 | 0 | BANK2 |
| 1 | 0 | 1 | |
| 1 | 0 | 0 | |
| 0 | 1 | 1 | BANK1 |
| 0 | 1 | 0 | |
| 0 | 0 | 1 | |
| 0 | 0 | 0 | BANK0 |

FIG. 13

SEMICONDUCTOR MEMORY DEVICE

CROSS-REFERENCE TO RELATED APPLICATION

This application is based on and claims the benefit of priority from the prior Japanese Patent Application No. 2003-65805, filed on Mar. 11, 2002, the entire contents of which is incorporated herein by reference.

BACKGROUND OF THE INVENTION

1. Field of the Invention

This invention relates to an electrically rewritable semiconductor memory device, especially to a non-volatile semiconductor memory in which a data write operation into a bank and a data read operation from another bank are concurrently accessible.

2. Description of Related Art

EEPROMs are configured to have electrically rewritable non-volatile memory cells. Recently, in such the EEPROMs, an automatically executing function for data rewriting is installed.
Based on the automatically executing function, input an address and data together with a write command, and a data write cycle is automatically performed for cells in selected memory area with periodical write pulse applications and verify reads.

On the other hand, it is required for the EEPROMs to take a long time for data rewriting in comparison with data read. Therefore, once a data rewrite operation is started, it is necessary for taking a long waiting period until the following data read operation becomes possible. Recently, in order to shorten such the waiting period, a simultaneous access or a "concurrent access" function is installed in an EEPROM with simultaneously accessible and plural memory areas such that a data write operation into a bank and a data read operation for another bank may be simultaneously performed.

Figure 13:
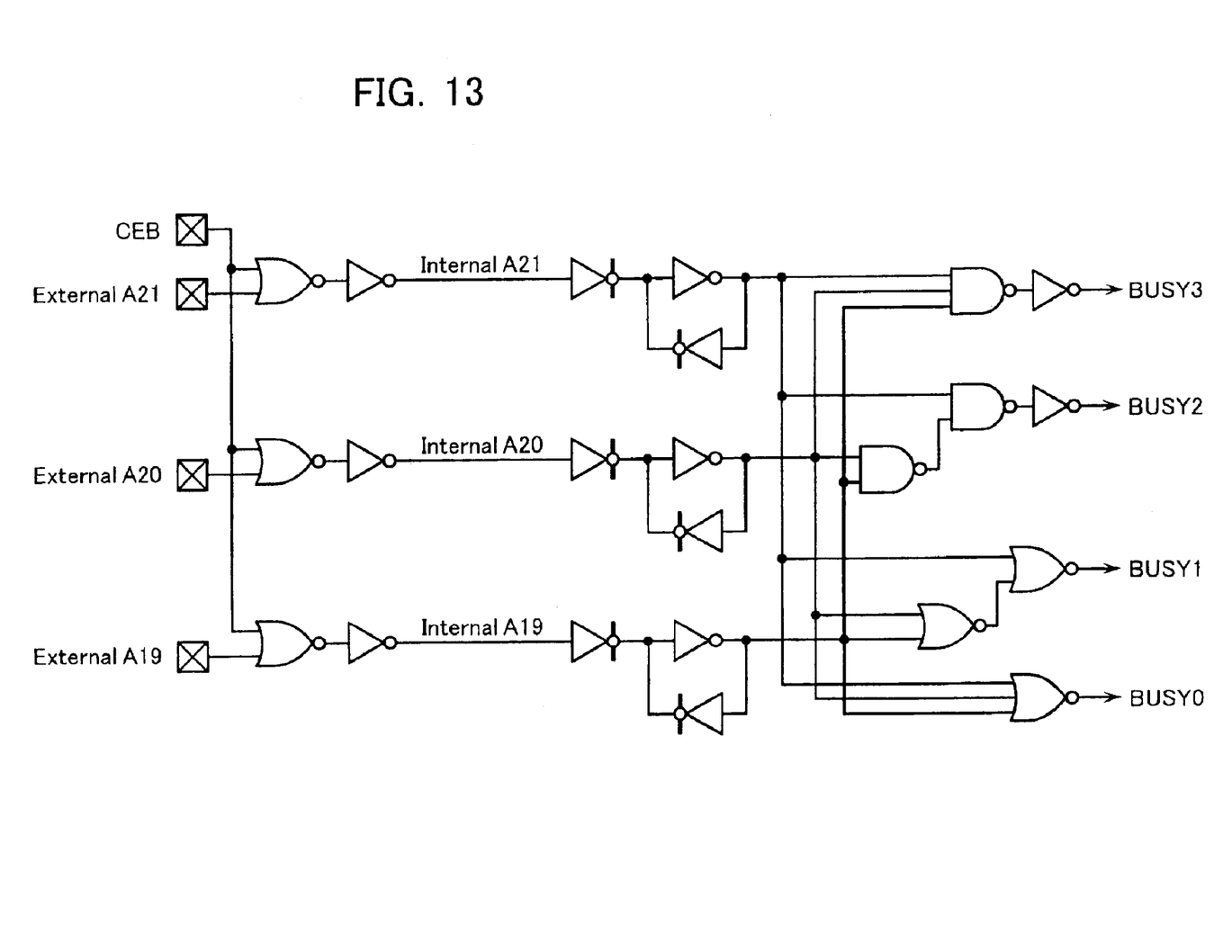
FIG. 13 shows a bank address decoder in the prior art.

In order to achieve such a simultaneous access function, for example, a bank address decoder as shown in FIG. 13 may be used. This is an example of an EEPROM chip with a capacity of 64 M byte in which the upper three address bits, A19–A21, in the entire address bits, A0–A21, are used for bank selecting. External address signals A19–A21 are latched by a signal CEB, which designates for automatically executing of a data rewrite operation, and then decoded to generate signals BUSY0–3 for determining a bank to be rewritten.

Figure 14:
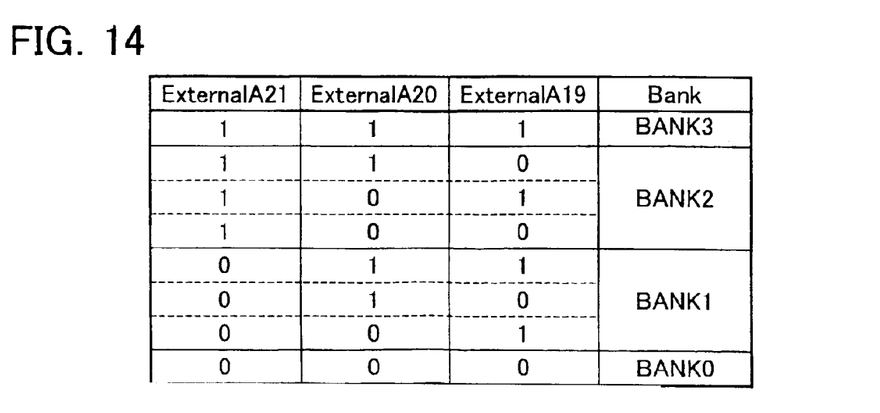
FIG. 14 shows a function of the bank address decoder.

FIG. 14 shows an assignment of the external address bits, A19–A21, to four banks, BANK0–BANK3. This is such an example that these banks are formed to have capacities as follows: BANK0=BANK3=8 Mbyte; BANK1=BANK2=24 Mbyte. For example, when the upper bits, A19, A20 and A21, are "1"s, the determining signals become as follows: BUSY3="H"; and BUSY0=BUSY1=BUSY2="L". As a result, the bank BANK3 is selected as a data rewriting one. Usually, the determining signals are output to outside of the chip as write busy signals for teaching that the selected bank is in a busy state. It is allowed for users to perform a data read operation with respect to any one of the banks BANK0, BANK1 and BANK2, busy signals of which are "L"s (i.e., BUSY0=BUSY1=BUSY2="L"), in parallel with the data rewrite operation for the bank BANK3.

In the concurrent accessible EEPROM in the prior art, sizes of the respective banks and a relationship between the input address and a to-be-rewritten bank are fixed as explained by use of FIG. 14. Usually, a small capacitive bank will be used for storing program, code and the like, while a large capacitive bank will be used for storing image data and so on. However, the EEPROM, in which the bank configuration is fixed as above-described, is impossible to meet many kinds of user's demands.

It has already been proposed a concurrent accessible EEPROM the bank configuration and the bank size of which are changeable (see Japanese Patent Application laid open (kokai) 13-325795). This Patent Application teaches such a scheme that ROM circuits are proposed for variably setting the bank configuration for each of a plurality of cores arranged.

SUMMARY OF THE INVENTION

A semiconductor memory device includes:

a plurality of banks with electrically rewritable memory cells arranged therein, the banks being configured to be simultaneously accessible in such a manner that a data write operation into a bank and a data read operation for another bank are simultaneously performed;

a write-use data bus commonly disposed for the plurality of banks;

a read-use data bus commonly disposed for the plurality of banks;

a write circuit connected to the write-use data bus; a read circuit connected to the read-use data bus;

a bank address decoder circuit for decoding external bank address signals for bank selecting to output internal bank address signals, the bank address decoder circuit having such an address conversion function that one of plural kinds of address conversions between the external bank address signals and the internal bank address signals is selectable; and a rewrite control circuit for sequence controlling a data write operation for a bank selected by the bank address decoder circuit.

DETAILED DESCRIPTION OF THE EMBODIMENTS

Referring to the drawings, the embodiments of the present invention will be described.

Figure 1:
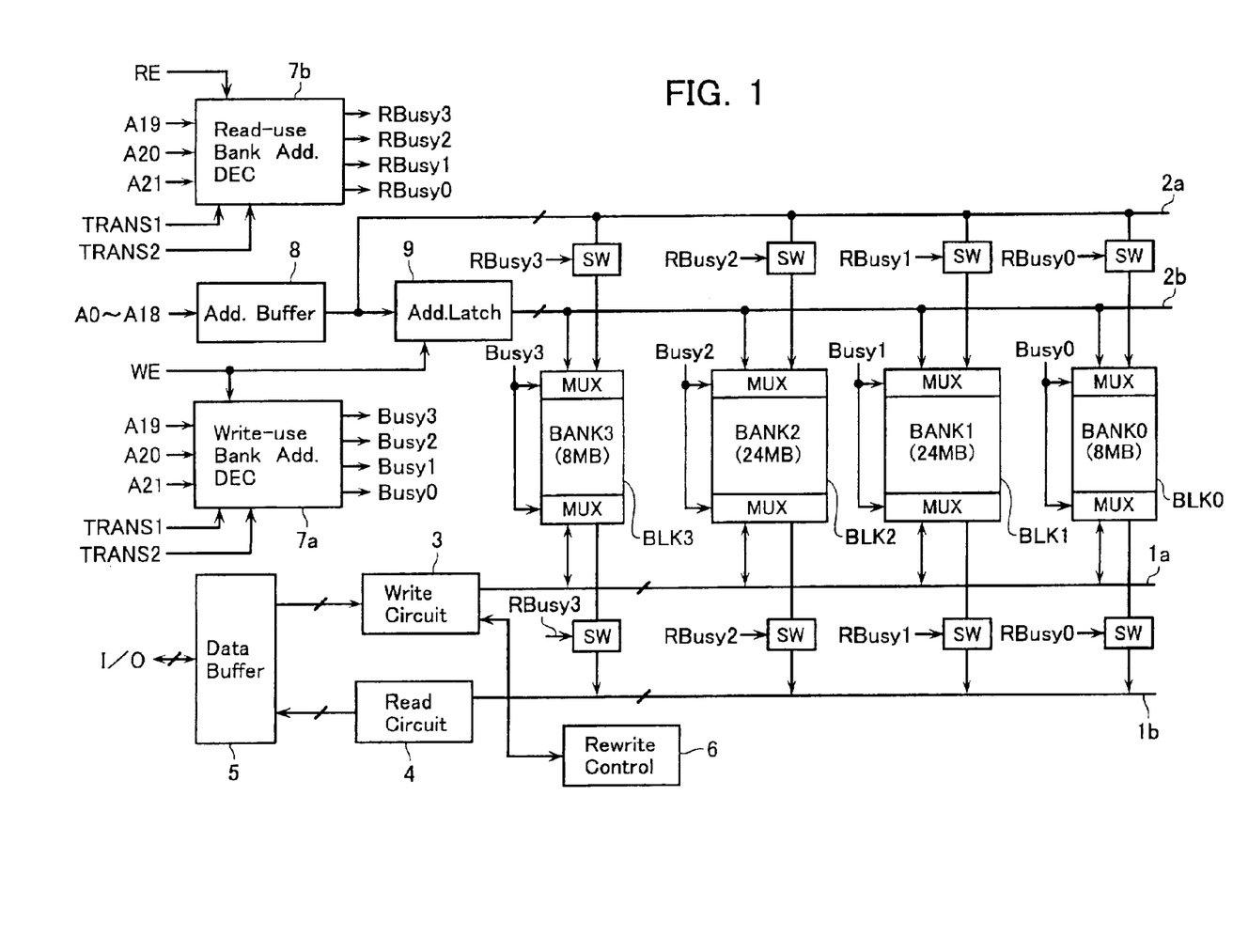
FIG. 1 shows an EEPROM configuration according to an embodiment of the present invention.

FIG. 1 is a circuit block of main parts of an EEPROM in accordance with an embodiment. A memory cell array is constituted by four cell blocks, BLK0–BLK3. The capacities of these cell blocks are as follows: BLK0=BLK3=8 Mbyte; and BLK1=BLK2=24 Mbyte. In FIG. 1, these cell blocks constitute banks, BANK0–BANK3, each of which is a concurrent access unit, respectively.

In order to make the EEPROM a simultaneous accessible one, in which a data rewriting operation into a bank may be performed simultaneously with a data reading for another bank, two data buses 1a, 1b and two address buses 2a, 2b are disposed commonly for all banks. The data bus 1a and the address bus 2a will be used for data writing, and the data bus 1b and the address bus 2b are for data reading.

Connected to the write-use data bus 1a is a write circuit 3 which includes verify-read sense amps. Connected to the read-use data bus 1b is a read circuit (i.e. read-use sense amps) 4. These write circuit 3 and read circuit 4 are possible to communicate with external data terminals I/O through a data buffer 5.

A write control circuit 6 is programmed to have a control sequence installed therein for automatically performing a data rewrite operation. In detail, data rewriting is performed, after erasing a predetermined erase unit in the cell array as a whole, by write pulse applications and verify reads as being repeated. The rewrite control circuit 6 will judge the write operation end by comparing the read data with the write data held in the write circuit 3. The above-described write pulse applications and verify reads are repeated until the end of data writing is judged for all write data bits.

As above-described, bank sizes in this embodiment are as follows: BANK0=BANK3=8 Mbyte, and BANK1=BANK=24 Mbyte. External addresses, A0–A21, are used for bank designating and accessing within a bank. The lower bits, A0–A18, in the external address signals are input to an address buffer 8. The address signals input to the address buffer 8 are transferred to the read-use address bus 2b as it is in a read mode, while there are stored in a address latch 9 on receipt of a write enable signal WE(="H") in a write mode. The address signals stored in the address latch 9 will be held until the data write operation is ended.

The upper three bits, A19–A21, within the external address signals constitute "external bank address signals" for bank selecting. The bank address signals are input to a write-use bank address decoders 7a and a read-use bank address decoder 7b, which are activated by the write enable signal WE and a read enable signal RE, respectively, and then decoded. Decode signals, Busy0–Busy3, will control multiplexers MUX for exchanging the connections between data buses 1a, 1b, address buses 2a, 2b and the respective banks. In detail, one of the decoded signals Busy–Busy3 becomes "H", whereby the write-use data bus 1a and the write-use address bus 2a are connected to an internal data bus and an internal address bus in a bank selected by the "H" decoded signal, respectively. These decoded signals, Busy0–Busy3, serve as judging signals for judging which bank is to be written, and are output outside of the chip as write busy signals. As a result, which bank is in a write state is taught to users and an external controller.

Decoded signals, Busy, input to the remaining banks except the selected one are held at "L". With respect to such the remaining banks, multiplexers MUX are controlled to connect the read-use address bus 2b and the read-use data bus 1b to inside of the banks. On connection ways between the read-use address bus 2b, the read-use data bus 1b and the respective banks, disposed are switches, SW, for switching the ways to be in a on-state or off-state. These switches SW constitute a decode gate circuit which is controlled by decoded signals, RBusy0–RBusy3, output from the bank address decoder 7b in a read mode. These decoded signals RBusy0–RBusy3 also are output outside of the chip as read busy signals for teaching which bank is in a read mode state to users and an external controller.

The data write operation in a bank selected by the output signals (decoded signals) from the write-use bank address decoder 7a may be performed based on the write data supplied to the selected bank from the write circuit 4 through the write-use data bus 2a by accessing by the address bits A0–A18 transferred to the write-use address bus 2a for accessing within the bank. When another external address signals for selecting one of the remaining banks with a read command during the writing operation, a bank is selected by the read-use bank address decoder 7b, and the corresponding switch, SW, becomes on, whereby the read-use address bus 2b and the read-use data bus 1b are connected to the selected bank. Then, the selected bank is accessed by the address signals transferred to the read-use address bus 2b, and the read data output to outside of the chip through the read-use data bus 1b.

Figure 2:
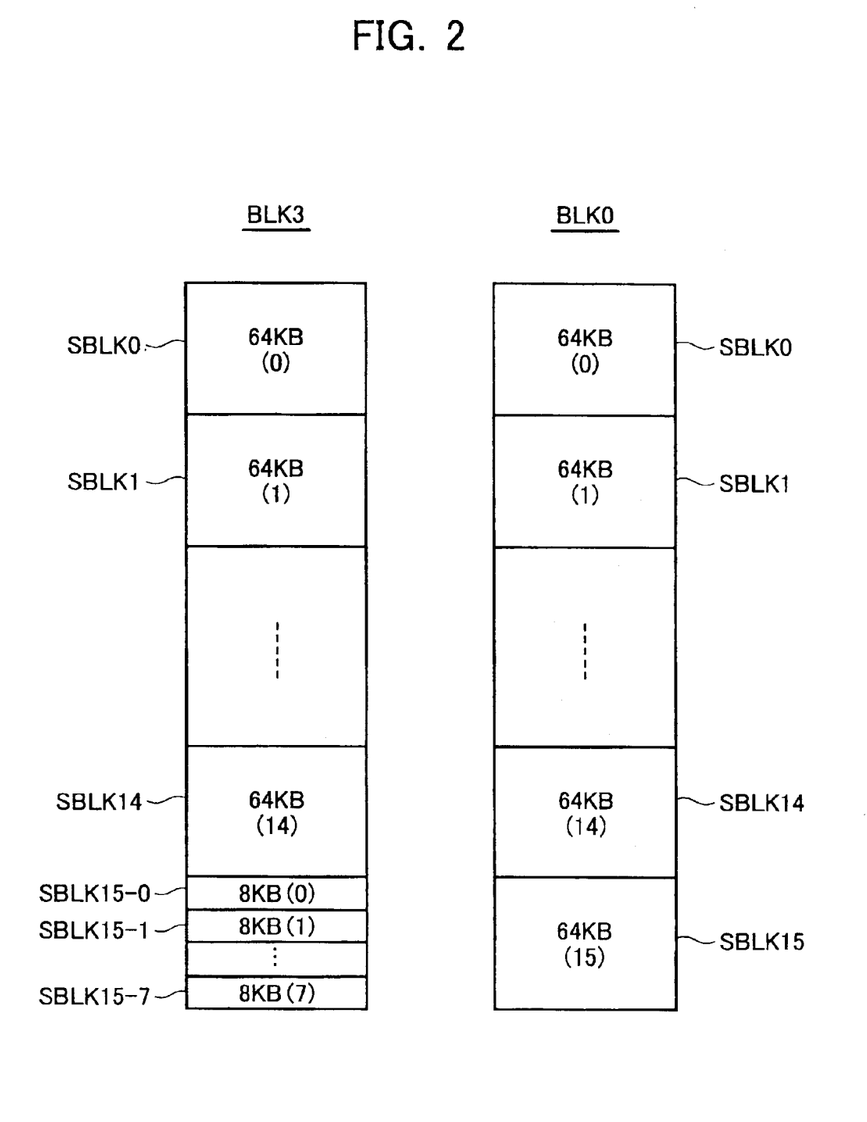
FIG. 2 shows configurations of cell blocks BLK0, BLK3 for constituting two banks BANK0, BANK3 in the EEPROM.

In this embodiment, it is configured to be capable of "alternation of the corresponding relationship between the banks and the cell blocks" (hereinafter, simply refers to "bank switch") in correspondence with uses of the EEPROM in spite of that internal bank addresses are statically assigned to cell blocks. A system in which banks are alternative will become effective in such a case that the plural cell blocks are arranged with different capacities and different data rewrite units. In detail, the effectiveness will be described by giving attention to two cell blocks, BLK0 and BLK3, which have the same capacity. The cell blocks BLK0, BLK3 have, for example, different internal configurations from each other as shown in FIG. 2 as follows: cell block BLK0 is formed of sixteen sub-cell blocks, SBLK0–SBLK15, each of which has a capacity of 64 Kbyte; and cell block BLK3 is formed of fifteen sub-cell blocks, SBLK0–SBLK14, each of which has a capacity of 64 Kbyte and eight sub-cell blocks, SBLK15-0 to SBLK15-7, each of which has a capacity of 8 Kbyte. Here, each of the sub-cell blocks becomes an erase unit (i.e., data rewrite unit) cell data of which are erased in a lump.

Internal bank addresses are statically assigned to such the cell blocks BLK0, BLK3 with different configurations as described above. In detail, FIG. 1 shows such a state that cell blocks BLK0 and BLK3 serve as banks BANK0 and BANK3, respectively. In contrast to this, be possible to make the cell blocks BLK0 and BLK3 serve as bank BANK3 and BANK0 with a reversed address order in comparison with the above-described state, and it is able to make the EEPROM meet many kinds of uses. In this embodiment, such the bank switch function is installed in the bank address decoders 7a, 7b.

Although the detailed configuration of the cell blocks BLK1, BLK2 is not shown, these also are preferably formed of plural sub-cell blocks as similar to the cell blocks BLK0, BLK3. The sub-cell blocks thereof may be formed as being different from each other, or as being identical with each other.

Although the cell blocks constituting the banks are formed of plural sub-cell blocks, each of which is a data rewrite unit, in this embodiment, it should be appreciated that the present invention is not limited to it. For example, the entire of each the cell block may be formed as a data rewrite unit.

Figure 3:
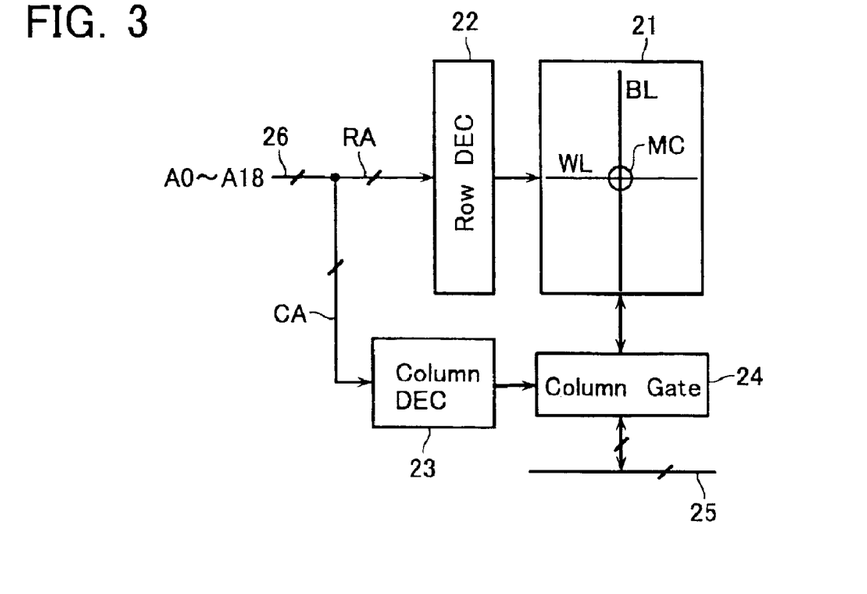
FIG. 3 shows an internal construction of a cell block.

FIG. 3 shows a detailed internal construction of a cell block. As shown in FIG. 3, the cell block has cell array 21 with a predetermined capacity, row decoder 22 for selecting word lines thereof, and column decoder 23 and column gate 24 for selecting bit lines thereof. Bit lines selected by the column gate 24 are in communication with an internal data bus 25. The internal data bus 25 will be selectively connected to the write-use data bus 1a or the read-use data bus 1b by the multiplexers MUX as above-described. Internal address bus 26 is selectively connected to the write-use address bus 2a or the read-use address bus 2b.

Figure 4:
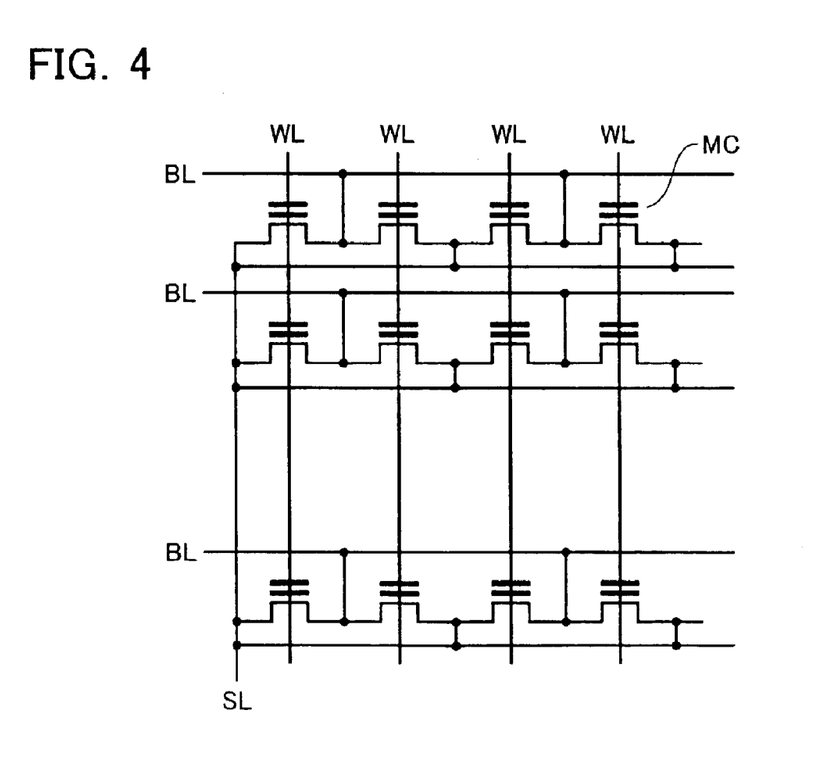
FIG. 4 shows an equivalent circuit of a cell array.

The cell array 21 is formed to arrange memory cells with such a stacked structure of a floating gate and a control gate at the respective crossing points between the bit lines BL and the word lines WL, thereby constituting a NOR-type cell array. It should be appreciated that a NAND-type cell array may be used.

In the NOR-type EEPROM, data write is performed by applying a positive write voltage to a selected word line, and by applying a high or a low voltage to a selected bit line in corresponding to a to-be-written data "0" or "1". Apply the high voltage to the bit line, and electrons are injected into the floating gate of the selected cell due to hot electron injection, whereby a high threshold state (data "0") is written into the cell. Data erase is performed for each data erase unit, cells of which share a well, in a bank by applying a negative voltage to all word lines therein, and by applying a positive voltage to the well so as to cause the electrons in the floating gates to be discharged to the channel by FN tunneling. As a result, all cells in the data erase unit are erased to a low threshold state (data "1"). In a case that each cell block constituting a bank is formed of a plurality of sub-cell blocks, each sub-cell block becomes an erase unit. Alternately, it may be allowed such a case that each cell block becomes a data erase unit. Although it is required to dispose an internal power supply which output the positive high voltage and the negative voltage, and wirings for transferring such the voltage to the respective circuits, these are omitted in FIG. 1.

In this embodiment, the bank address decoders 7a, 7b have a function of changing the bank configuration adapted to a simultaneous access of a data rewrite operation and a data read operation. Such the bank switch function will be described in detail.

Figure 5:
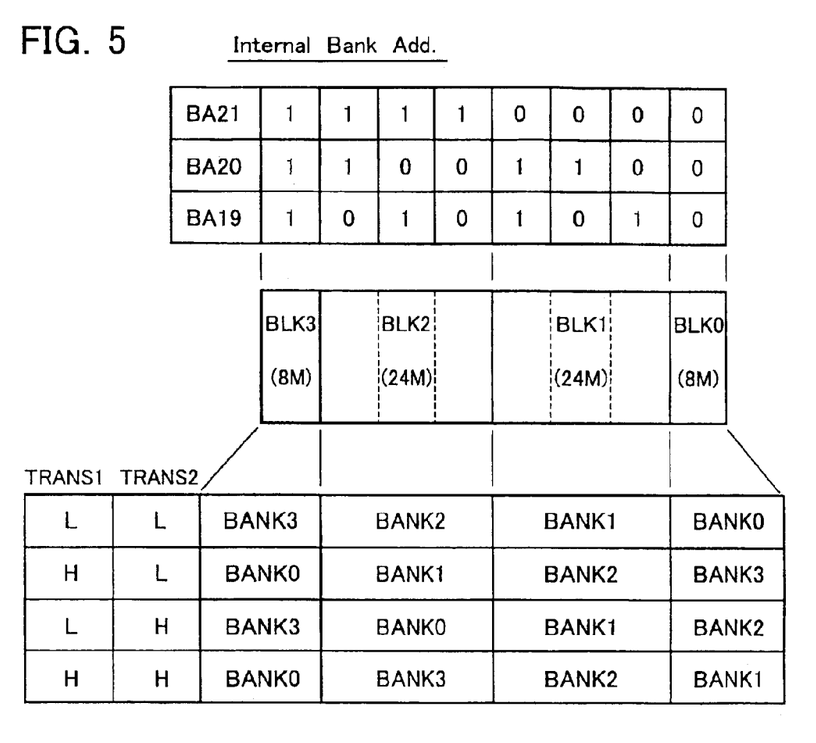
FIG. 5 shows a principle of the bank switch of the EEPROM.

FIG. 5 shows a principle of the bank switch by use of address conversion in the bank address decoders 7a, 7b. Memory cell array has, as described above, four cell blocks BLK0–BLK3 which are prepared for constituting four banks. As shown in FIG. 5, internal bank addresses BA19–BA21 are fixedly assigned to the cell blocks BLK0–BLK3. By use of address conversion between the internal bank addresses BA0–BA3 and the external bank addresses expressed by the upper three bits A19–A21 in the external address bits A0–A21, some combinations between the cell blocks BLK0–BLK3 and the banks BANK0–BANK3 designated by the external bank addresses A19–A21 are prepared to be changeable as shown in FIG. 5.

In detail, switch control signals expressed by two bits, TRANS1 and TRANS2, are input to the bank address decoders 7a, 7b. By use of combinations of "H" and "L" of the switch control signals TRANS1 and TRANS2, corresponding relationships between the cell blocks BLK0–BLK3 and the banks BANK0–BANK3 are determined as shown in FIG. 5. The bank construction shown in FIG. 1 corresponds to such a case that cell blocks BLK0, BLK1, BLK2 and BLK3 are adapted to banks BANK0, BANK1, BANK2 and BANK3, respectively, in such a condition of TRANS1=TRANS2="L".

Figure 7:
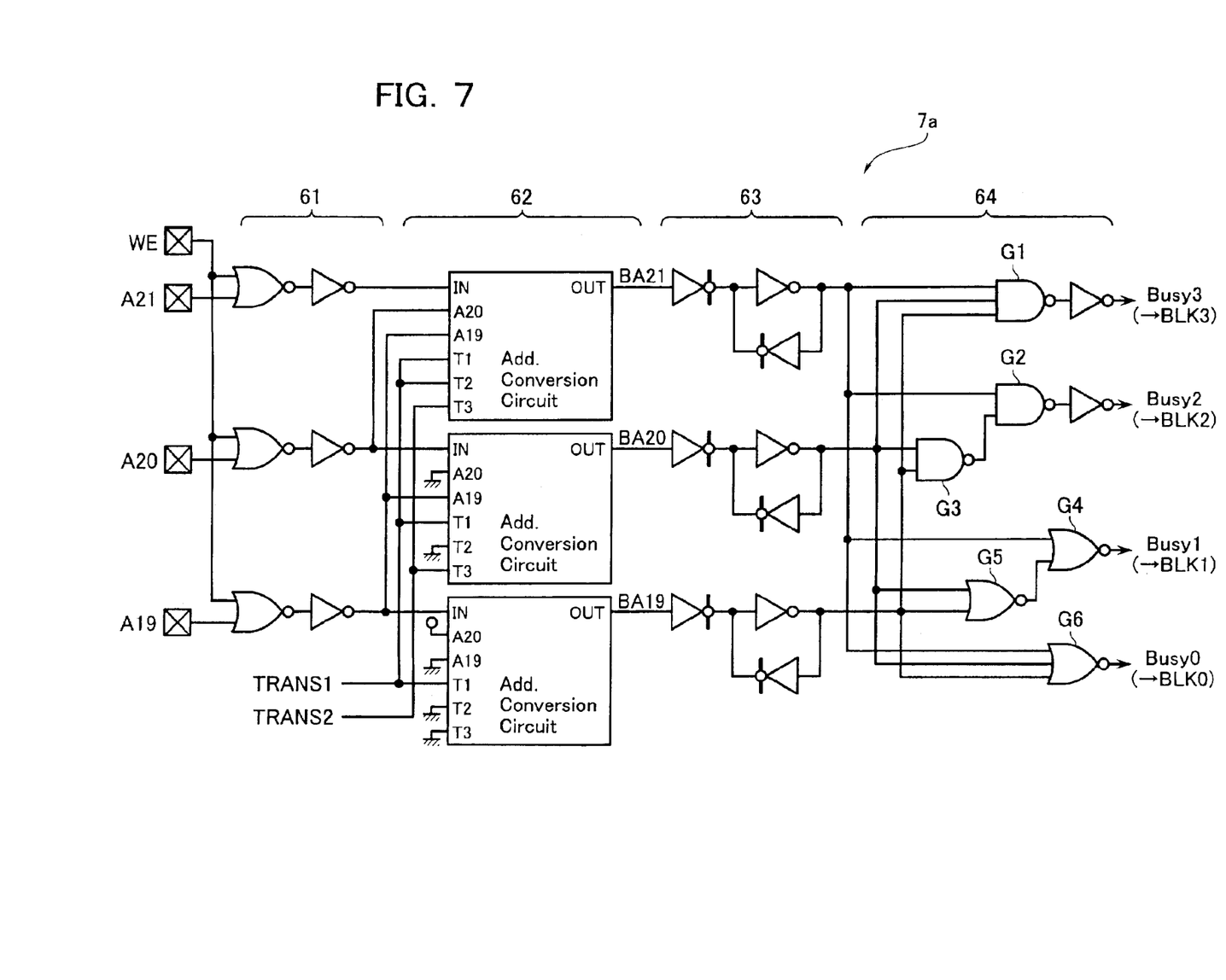
FIG. 7 shows a write-use bank address decoder configuration in the EEPROM.

FIG. 7 shows a detailed construction of the bank address decoder 7a with such the address conversion function. As shown in FIG. 7, the upper bits A19–A21, which are used for bank designation in the external address, are input to address input gates 61 controlled by the write enable signal WE. Input external bank addresses A19–A21 are converted to the internal bank addresses BA19–BA21 by address conversion circuits 62. The internal bank address signals BA19–BA21 are stored in address latches 63, and then decoded by decoders 64, whereby decoded signals BUSY0–BUSY3 are output for selecting one cell block.

The read-use bank address decoder 7b is configured as same as the write-use bank address decoder 7a except that the address latches 63 shown in FIG. 7 are removed. This is because that it is not required to hold address signals in the data read mode, while it is necessary in the data write mode for holding address signals until the write operation is ended.

The decode circuit 64 shown in FIG. 7 is configured to select one of the cell blocks BLK0–BLK3 due to one of the combinations of the internal bank addresses BA19–BA21 as follows: when all of BA19–BA21 are "1", a NAND gate G1 outputs BUSY3="H", whereby cell block BLK3 is selected; when BA21="1", and BA20 and BA19 are not "1" at the same time, BUSY2="H" is output through NAND gates G2 and G3, whereby cell block BLK2 is selected; When BA21="0", and BA19 and BA20 are not "0" at the same time, BUSY1="H" is output through NOR gates G4 and G5, whereby cell block BLK1 is selected; and when all of BA19–BA21 are "0", a NOR gate G6 output BUSY0="H", whereby cell block BLK0 is selected. This is the static assignment of the internal bank address BA19–BA21 to cell blocks as shown in FIG. 5.

Figure 8:
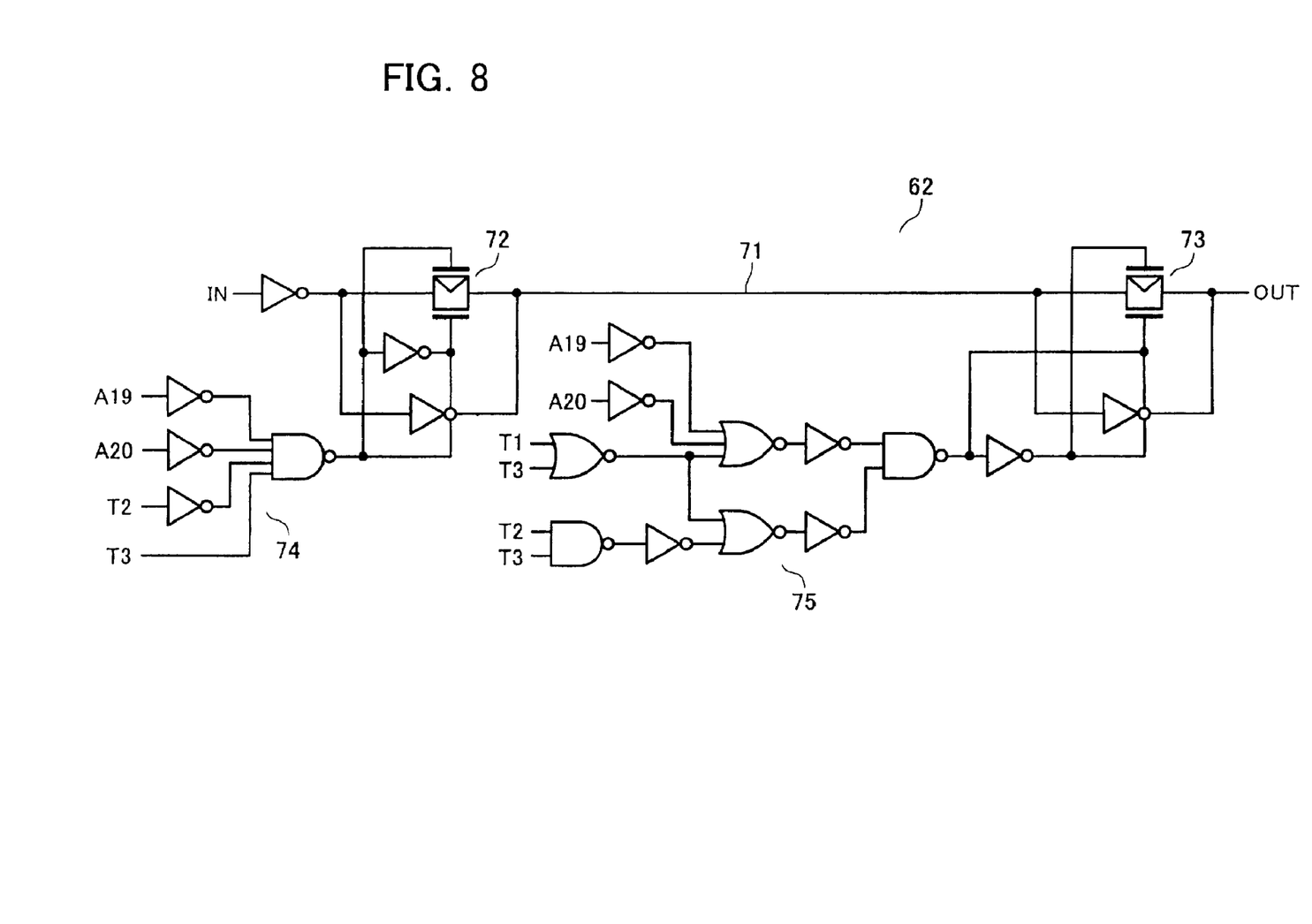
FIG. 8 shows an address conversion circuit in the bank address decoder.

External bank designation is done by the external addresses A19–A21. As a result of that plural address conversions between the external address signals A19–A21 and the internal address signals BA19–BA21 are prepared as been changeable, it is possible to select one of the corresponding relationships between the cell blocks BLK0–BLK3 and the banks BANK0–BANK3. In detail, in this embodiment, the address conversion circuits 62 are disposed with the same configuration as shown in FIG. 8 for the respective address bits in consideration of fabrication easiness. Only by designing the wiring connections to these input terminals, one of four kinds of bank configurations may be obtained.

As shown in FIG. 8, the address conversion circuit 62 has two transfer gates 72 and 73 serially disposed on a transfer way of each address bit, which transfer a bit data with logic inversion or without logic inversion. To control these transfer gates 72, 73, disposed are logic circuits 74 and 75. The logic circuits 74, 75 control the transfer gates 72, 73 by specific combination logics between the lower two bits, A19 and A20, in the external address bits A19–A21 and the switch control signals TRANS1 and TRANS2.

Figure 9:
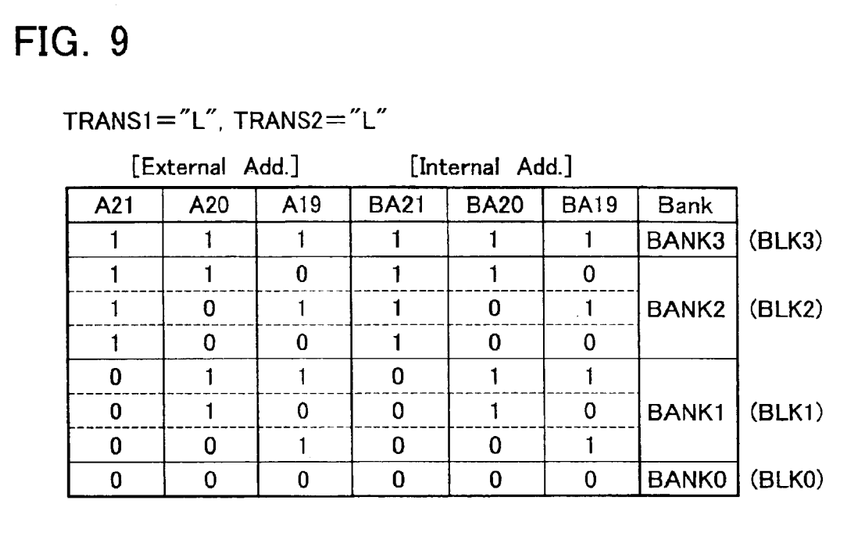
FIG. 9 shows a first bank address conversion mode according to the address conversion circuit.

In detail, the logic circuits 74, 75 are formed of logic gates to be able to achieve four bank constructions shown in FIGS. 9 to 12. FIG. 9 shows a case that the switch control signals are set as TRANS1=TRANS2="L". In this case, the external addresses A19–A21 become to be the internal bank addresses of BA19–BA21 as there are. The external address of A19=A20=A21="1" designates the bank BANK3, which corresponds to the cell block BLK3 selected by the internal bank address of BA19=BA20=BA21="1". The remaining bank configurations are as follows; the cell blocks BLK2, BLK1 and BLK0 serve as the banks BANK2, BANK1 and BANK0, respectively. This result is the same as that of FIG. 13, in which the address conversion circuits 62 are not disposed.

Figure 10:
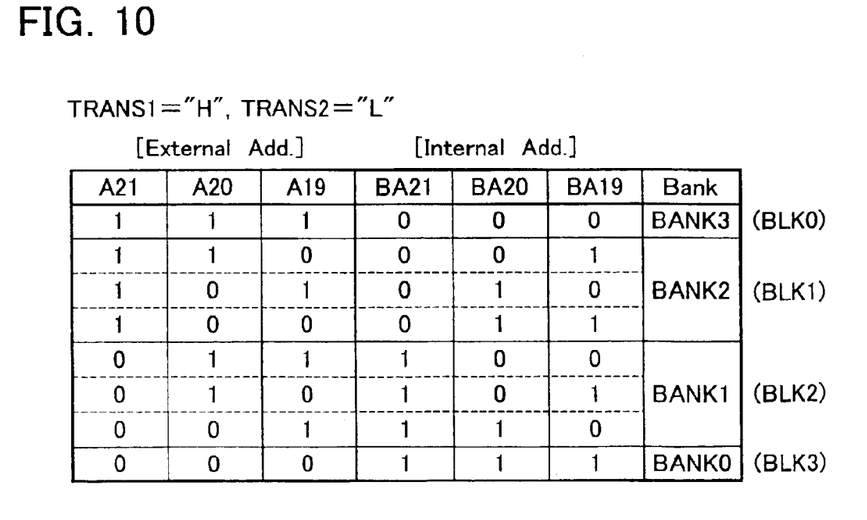
FIG. 10 shows a second bank address conversion mode according to the address conversion circuit.

FIG. 10 shows another case that the switch control signals are set as TRANS1="H", and TRANS2="L". In this case, the logic gate circuits 74, 75 have such a combination logic that what all of the external address bits A19–A21 are inverted becomes the internal bank addresses BA19–BA21. Since the relationship between the bank addresses BA19–BA21 and the cell blocks BLK0–BLK3 is fixed, the cell blocks BLK0, BLK1, BLK2 and BLK3 serve as the banks BANK3, BANK2, BANK1 and BANK0, respectively, in this case.

In FIG. 9, the bank BANK0 selected by a head address of A19=A20=A21="0" in the external addresses corresponds to the cell block BLK0. To the contrary, in FIG. 10, the bank BANK0 selected by the head address of A19=A20=A21="0" corresponds to the cell block BLK3. Since these cell blocks BLK0, BLK3 have the same capacity, the banks BANK0, BANK3 switched between the cases of FIG. 9 and FIG. 10 have the same bank size. However, even if the bank switch is done without bank size change, it is significant for such a case that the inner configurations of the cell blocks BLK0, BLK3 are different from each other as explained by use of FIG. 2. It is because of that it is possible to change the address order of the cell blocks BLK0 and BLK3, which are formed to have different rewrite units, in response to uses.

Figure 11:
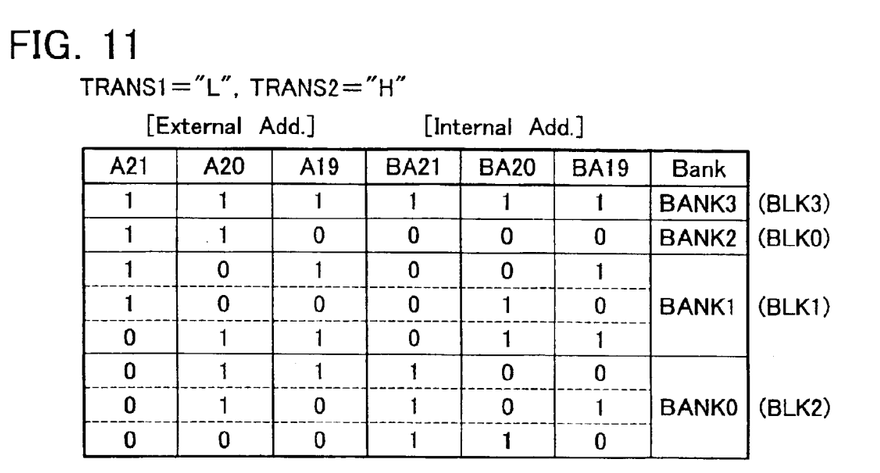
FIG. 11 shows a third bank address conversion mode according to the address conversion circuit.

In the cases shown in FIG. 9 and FIG. 10, there are no bank switches between the banks BANK1 and BANK2 and no bank size changes. In the case of FIG. 11, the bank sizes are changed in comparison with the cases of FIGS. 9 and 10. In FIG. 11, the switch control signals are set as follows; TRANS1="L", TRANS2="H". In this case, the external bank address A19=A20=A21="1" becomes as it is the internal bank address BA19=BA20=BA21="1". Therefore, as similar to FIG. 9, the cell block BLK3 becomes the bank BANK3. On the other hand, the address expressed by A21=A20="0", and A19="1" is converted to the internal bank address of BA21=BA20=BA19="0", resulting that the cell block BLK0 becomes the bank BANK2. Therefore, while the bank BANK2 is a 24 MByte cell block in the cases of FIGS. 9 and 10, the bank BANK2 is an 8 MByte cell block in the case of FIG. 11. In addition, such an address conversion is done that cell block BLK1 serves as bank BANK1, and cell block BLK2 serves as bank BANK0.

Figure 12:
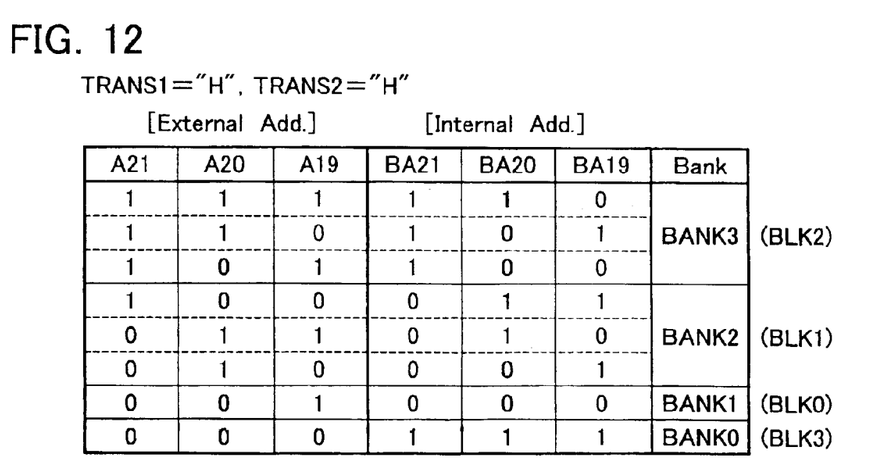
FIG. 12 shows a fourth bank address conversion mode according to the address conversion circuit.

In the case of FIG. 12, although detailed descriptions will be cut down, such an address conversion is done by a condition of TRANS1=TRANS2="H" that cell blocks BLK0, BLK1, BLK2, and BLK3 serve as banks BANK1, BANK2, BANK3 and BANK0, respectively.

The switch control signals TRAN1, TRAN2, which are used for the bank switch as described above, may be programmed as internal signals generated in the chip. Such an internal signal generation circuit is, for example, formed of a ROM circuit 81 shown in FIG. 6A or a fuse circuit 82 shown in FIG. 6B. These ROM circuit 81 and fuse circuit 82 are programmed to generate a combination of the switch control signals TRANS1, TRANS2 in correspondence with a test result or uses.

Figure 6A:
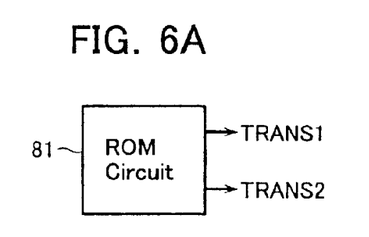
FIGS. 6A–6C show examples of the switch signal generation circuit in the EEPROM.
Figure 6B:
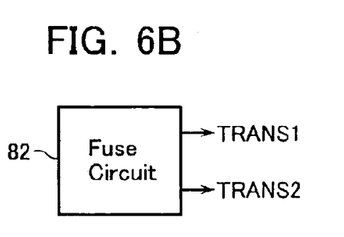

In detail, form the ROM circuit 81 shown in FIG. 6A with the same EEPROM cells as the cell array, and it is possible to program it at a test timing after packaging the chip to settle a desired bank configuration. In a case that the fuse circuit 82 is used, programming thereof may be performed at a test timing in the wafer process. By use of such schemes, it is possible to obtain an EEPROM chip which is selectively set to have one of plural bank configurations prior to shipping thereof. In order to make the ROM circuit 81 or fuse circuit 82 automatically generate the switch control signals TRAN1, TRAN2 in response to power-on, it is required to install a power-on reset circuit in the EEPROM chip.

Figure 6C:
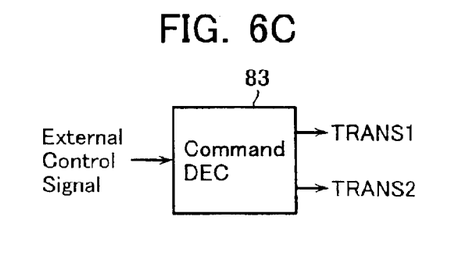

It is also possible to generate the switch control signals TRANS1, TRANS2 as being externally controllable. For example, install a command decoder 83 serving as an internal signal generator as shown in FIG. 6C, and it is able to generate the switch control signals TRANS1, TRANS2 by decoding external control signals input for bank designating. As a result, it may be provided an EEPROM chip a bank configuration of which is selectable in plural types for users.

Further, it should be appreciated that it is possible to make the chip be able to directly input the switch control signals TRANS1, TRANS2 from the external terminals for bank switching.

In addition, although not shown in the drawings, it is also possible to achieve the function corresponding to the address conversion circuit 62 in the bank address decoder shown in FIG. 7 by changing address signal wiring connections. In detail, change a mask for metal wiring forming step in the wafer process, it is possible to obtain an EEPROM chip which is selectively set to have one of plural bank configurations.

As above-described, according to the embodiment, it is provided an EEPROM adapted to many kinds of uses, in which concurrent accessible bank configurations may be changeable for simultaneously performing a data write and a data read, with such a bank address decoder that has an address conversion function controlled by a switch control signal.

In the embodiment, an example with four banks has been explained. Note here that a case with three or more banks and another case with two banks have different conditions from each other. In the former case, it is necessary to use a read-use bank address decoder as explained in the embodiment for selecting a bank for data reading during another bank is in a write busy state. In addition, it is also required to dispose an address conversion circuit in such the read-use bank address decoder, as similar to the write-use bank address decoder. In contrast, in the latter case that has, for example, two banks, large and small, since when one bank is in a write busy state, remained is another one, it is not necessary to dispose any read-use bank address decoder.

Having described the embodiments of the present invention, other embodiments and variations will be apparent to those skilled in the art. Therefore, the invention should not be viewed as limited to the disclosed embodiments but rather should be viewed as limited only by the spirit and scope of the appended claims.

What is claimed is:

1. A semiconductor memory device comprising:
   a plurality of banks with electrically rewritable memory cells arranged therein, said banks being configured to be simultaneously accessible in such a manner that a data write operation into a bank and a data read operation for another bank are simultaneously performed;
   a write-use data bus commonly disposed for said plurality of banks;

a read-use data bus commonly disposed for said plurality of banks;

a write circuit connected to said write-use data bus;

a read circuit connected to said read-use data bus;

a bank address decoder circuit for decoding external bank address signals for bank selecting to output internal bank address signals, said bank address decoder circuit having such an address conversion function that one of plural kinds of address conversions between said external bank address signals and said internal bank address signals is selectable; and a rewrite control circuit for sequence controlling a data write operation for a bank selected by said bank address decoder circuit, wherein said bank address decoder circuit comprises:

a write-use bank address decoder configured to convert first external bank address signals selecting a bank to be rewritten to first internal bank address signals based on one of said plural kinds of address conversions, and decode said first internal bank address signals; and a read-use bank address decoder configured to convert second external bank address signals selecting a bank to be read to second internal bank address signals based on one of said plural kinds of address conversions, and decode said second internal bank address signals.

2. The semiconductor memory device according to claim 1, wherein said write-use bank address decoder comprises:

first address input gates for inputting said first external bank address signals;

a first address conversion circuit for converting said first bank external address signals to said first internal bank address signals in response to a bank switch control signal prepared for selecting one of said plural kinds of address conversions;

an address latch for holding said first internal bank address signals converted by said first address conversion circuit; and a first decode circuit for decoding said first internal bank address signals held in said address latch, said first internal bank address being statically assigned to one of cell blocks constituting said plurality of banks.

3. The semiconductor memory device according to claim 2, wherein said first address conversion circuit comprises:

transfer circuits disposed for the respective bits of said first external bank address signals to be able to transfer data bits without logic inverting or with logic inverting; and logic gate circuits for causing said transfer circuits to transfer data bits without logic inverting or with logic inverting by a logic between said bank switch signal and certain bits in said first external bank address signals.

4. The semiconductor memory device according to claim 1, wherein said read-use bank address decoder comprises:

second address input gates for inputting said second external bank address signals;

a second address conversion circuit for converting said second external bank address signals to said second internal bank address signals in response to a bank switch control signal prepared for selecting one of said plural kinds of address conversions; and a second decode circuit for decoding said second internal bank address signals which are statically assigned to one of cell blocks constituting said plurality of banks.

5. The semiconductor memory device according to claim 1, wherein decoded signals output from said write-use address decoder and said read-use address decoder are output to outside of the chip as busy signals.

6. The semiconductor memory device according to claim 1, further comprising:

a ROM circuit configured to be programmed to generate said bank switch signal.

7. The semiconductor memory device according to claim 1, further comprising:

a fuse circuit configured to be programmed to generate said bank switch signal.

8. The semiconductor memory device according to claim 1, further comprising:

a command decoder configured to generate said bank switch signal in response to an external command signal.

9. A semiconductor memory device comprising:

a plurality of banks with electrically rewritable memory cells arranged therein, said banks being configured to be simultaneously accessible in such a manner that a data write operation into a bank and a data read operation for another bank are simultaneously performed;

a write-use data bus commonly disposed for said plurality of banks;

a read-use data bus commonly disposed for said plurality of banks;

a write circuit connected to said write-use data bus;

a read circuit connected to said read-use data bus;

a bank address decoder circuit configured to decode external bank address signals for a bank selection to output internal bank address signals, said bank address decoder circuit having such an address conversion function that one of plural kinds of address conversions between said external bank address signals and said internal bank address signals is selectable; and a rewrite control circuit configured to sequence control a data write operation for a bank selected by said bank address decoder circuit, wherein said bank address decoder circuit comprises:

a write-use bank address decoder configured to convert first external bank address signals selecting a bank to be rewritten to first internal bank address signals based on one of said plural kinds of address conversions, and decode said first internal bank address signals; and a read-use bank address decoder configured to convert second external bank address signals selecting a bank to be read to second internal bank address signals based on one of said plural kinds of address conversions, and decode said second internal bank address signals.

* * * * *